United States Patent
Tseng

(10) Patent No.: US 11,250,523 B2
(45) Date of Patent: Feb. 15, 2022

(54) EXPANDABLE COMBINATION ELECTRIC METER

(71) Applicant: CHICONY POWER TECHNOLOGY CO., LTD., New Taipei (TW)

(72) Inventor: Wen-Ning Tseng, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 296 days.

(21) Appl. No.: 16/566,601

(22) Filed: Sep. 10, 2019

(65) Prior Publication Data

US 2021/0027398 A1 Jan. 28, 2021

(30) Foreign Application Priority Data

Jul. 26, 2019 (TW) .................................. 108126684

(51) Int. Cl.
*G06Q 50/06* (2012.01)
*G01D 4/00* (2006.01)
*G01R 19/25* (2006.01)
*G01R 22/06* (2006.01)

(52) U.S. Cl.
CPC ............. *G06Q 50/06* (2013.01); *G01D 4/002* (2013.01); *G01R 19/2513* (2013.01); *G01R 22/06* (2013.01)

(58) Field of Classification Search
CPC ...................................................... G06G 50/06
USPC ....................................................... 700/286
See application file for complete search history.

(56) References Cited

U.S. PATENT DOCUMENTS

| | | |
|---|---|---|
| 2009/0066317 A1 | 3/2009 | de Buda |
| 2010/0007219 A1 | 1/2010 | de Buda et al. |
| 2010/0007336 A1 | 1/2010 | de Buda |
| 2012/0041696 A1 | 2/2012 | Sanderford, Jr. et al. |
| 2012/0232915 A1 | 9/2012 | Bromberger |
| 2013/0066571 A1* | 3/2013 | Chamarti ................ G05F 1/66 702/62 |
| 2014/0125441 A1 | 5/2014 | Hongping et al. |
| 2014/0214729 A1 | 7/2014 | Lin et al. |
| 2017/0153124 A1 | 6/2017 | Li et al. |
| 2018/0232819 A1* | 8/2018 | Stocker ................ G06Q 50/06 |
| 2018/0348268 A1 | 12/2018 | Patton |

(Continued)

FOREIGN PATENT DOCUMENTS

| | | |
|---|---|---|
| CN | 102105802 B | 8/2013 |
| TW | 201435352 A | 9/2014 |
| TW | I464411 B | 12/2014 |

(Continued)

*Primary Examiner* — Ricky Go

(74) *Attorney, Agent, or Firm* — Muncy, Geissler, Olds & Lowe, P.C.

(57) ABSTRACT

An expandable combination electric meter comprises a first electric meter and a second electric meter. The first electric meter includes a processing unit, a first electricity measuring unit, a power supply unit and an expansion connecting unit. The processing unit is coupled with the first electricity measuring unit, the power supply unit and the expansion connecting unit. The power supply unit outputs a working power to the processing unit, the first electricity measuring unit, and the expansion connecting unit. The second electric meter is connected with the first electric meter through the expansion connecting unit. The working power is transmitted to the second electric meter through the expansion connecting unit for enabling the second electric meter.

7 Claims, 5 Drawing Sheets

(56) References Cited

U.S. PATENT DOCUMENTS

2019/0257668 A1\* 8/2019 Yohan .................... G06Q 50/06

FOREIGN PATENT DOCUMENTS

| TW | I522625 B | 2/2016 | |
|----|----|----|----|
| TW | 201638714 A | 11/2016 | |
| TW | 201719547 A | 6/2017 | |
| WO | WO 2009/009878 A1 | 1/2009 | |
| WO | WO-2015024068 A1 \* | 2/2015 | ........... G01R 22/065 |

\* cited by examiner

EXPANDABLE COMBINATION ELECTRIC METER

CROSS REFERENCE TO RELATED APPLICATIONS

This Non-provisional application claims priority under 35 U.S.C. § 119(a) on Patent Application No(s). 108126684 filed in Taiwan, Republic of China on Jul. 26, 2019, the entire contents of which are hereby incorporated by reference.

BACKGROUND

Technology Field

This disclosure relates to an electric meter and in particular, to an expandable electric meter applied to the energy managing system of a smart building.

Description of Related Art

As the developments of technology and economy, the electric energy has become one of the most important energy sources in our lives. Recently, the electricity consumption of electrical products in people's livelihood is sufficiently increase, so that the demand for electricity is also growing. At present, the billing method for electricity consumption is to obtain electricity consumption data by manually checking the electric meter, and then to calculate the electricity charges. In order to satisfy the rapidly developing social needs, the multi-user smart meter has emerged as the times require. The multi-user smart meter can retrieve the electricity consumption data by remote control method instead of the traditional method of checking and recording the data of the electric meters of all users step by step.

However, the conventional multi-user smart meter adopts the measurement method of one electrical circuit and one electric meter, that is, each user of a collective unit (e.g. one community or one floor) needs to have an individual electric meter. Moreover, in the collective unit, it is necessary to design individual wiring for the electric meter of each user, which undoubtedly increases the installation space, installation time and wiring quantity of the electric meters, and increases the amount of wires and the probability of electrical wiring errors.

SUMMARY

An objective the present disclosure is to provide an expandable combination electric meter that can decrease the wiring quantity, installation time and electrical circuit cost, and reduce the amount of wires and the probability of electrical wiring errors.

Another objective of the present disclosure is to provide an expandable combination electric meter that can flexibly increase the amount of electric meters and decrease the installation space of the electric meters according to the number of electricity loops to be monitored.

To achieve the above, this disclosure discloses an expandable combination electric meter, which comprises a first electric meter and a second electric meter. The first electric meter comprises a processing unit, a first electricity measuring unit, a power supply unit and an expansion connecting unit. The processing unit is coupled with the first electricity measuring unit, the power supply unit and the expansion connecting unit. The power supply unit outputs a working power to the processing unit, the first electricity measuring unit, and the expansion connecting unit. The second electric meter is connected with the first electric meter through the expansion connecting unit. The working power outputted from the power supply unit is transmitted to the second electric meter through the expansion connecting unit for enabling the second electric meter.

In one embodiment, the first electricity measuring unit comprises a first voltage conversion subunit and a first current conversion subunit, the first voltage conversion subunit converts an external input voltage to a first voltage signal, and the first current conversion subunit converts a first external input current to a first current signal.

In one embodiment, the first electricity measuring unit further comprises a first electricity calculation subunit, the first electricity calculation subunit is coupled with the first voltage conversion subunit and the first current conversion subunit, and the first electricity calculation subunit generates a first electricity consumption data according to the first voltage signal and the first current signal.

In one embodiment, the second electric meter comprises a second electricity measuring unit, an upstream expansion connecting unit, and a downstream expansion connecting unit, and the second electricity measuring unit is coupled with the upstream expansion connecting unit and the downstream expansion connecting unit. The upstream expansion connecting unit is disposed corresponding to the expansion connecting unit. When the upstream expansion connecting unit is connected with the expansion connecting unit, the working power and the external input voltage are transmitted to the second electricity measuring unit through the expansion connecting unit and the upstream expansion connecting unit.

In one embodiment, the second electricity measuring unit comprises a second voltage conversion subunit and a second current conversion subunit, the second voltage conversion subunit converts the external input voltage to a second voltage signal, and the second current conversion subunit converts a second external input current to a second current signal.

In one embodiment, the second electricity measuring unit further comprises a second electricity calculation subunit, the second electricity calculation subunit is coupled with the second voltage conversion subunit and the second current conversion subunit, and the second electricity calculation subunit generates a second electricity consumption data according to the second voltage signal and the second current signal.

In one embodiment, when the expansion connecting unit is connected with the upstream expansion connecting unit, the processing unit obtains the second electricity consumption data through the expansion connecting unit and the upstream expansion connecting unit.

In one embodiment, the first electric meter further comprises a communication unit coupled with the processing unit, and a data collecting device retrieves the first electricity consumption data and the second electricity consumption data in batch through the communication unit and the processing unit.

In one embodiment, the second electric meter further comprises a serial number setting unit, the serial number setting unit comprises a serial number, and when the expansion connecting unit is connected with the upstream expansion connecting unit, the processing unit retrieves the serial number through the expansion connecting unit and the upstream expansion connecting unit for identifying the second electric meter.

In one embodiment, the expandable combination electric meter further comprises a third electric meter, and the second electric meter is connected with the third electric meter through the downstream expansion connecting unit. A serial number of the second electric meter is different from a serial number of the third electric meter.

As mentioned above, in the expandable combination electric meter, the first electric meter outputs the working power to the processing unit, the first electricity measuring unit and the expansion connecting unit, and the second electric meter is connected with the first electric meter through the expansion connecting unit. The working power outputted from the power supply unit is transmitted to the second electric meter through the expansion connecting unit for enabling the second electric meter. Accordingly, it is unnecessary to configure an individual power supply unit for each expanded electric meter (e.g. the second electric meter), so that the wiring quantity, installation time and circuit cost for installing the main electric meter and the expanded electric meter or for installing the expanded electric meter and the additional expanded electric meter can be decreased. Moreover, the amount of wires and the probability of electrical wiring errors can be reduced. In addition, since the expanded electric meter (e.g. the second electric meter) can be connected with the main electric meter (e.g. the first electric meter) through the expansion connecting unit, the expandable combination electric meter of this disclosure can flexibly increase the amount of electric meters and decrease the installation space of the electric meters according to the number of electricity loops to be monitored.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The expandable combination electric meter according to an embodiment of this disclosure can be applied to, for example but not limited to, the energy managing system of a smart building.

Figure 1A:
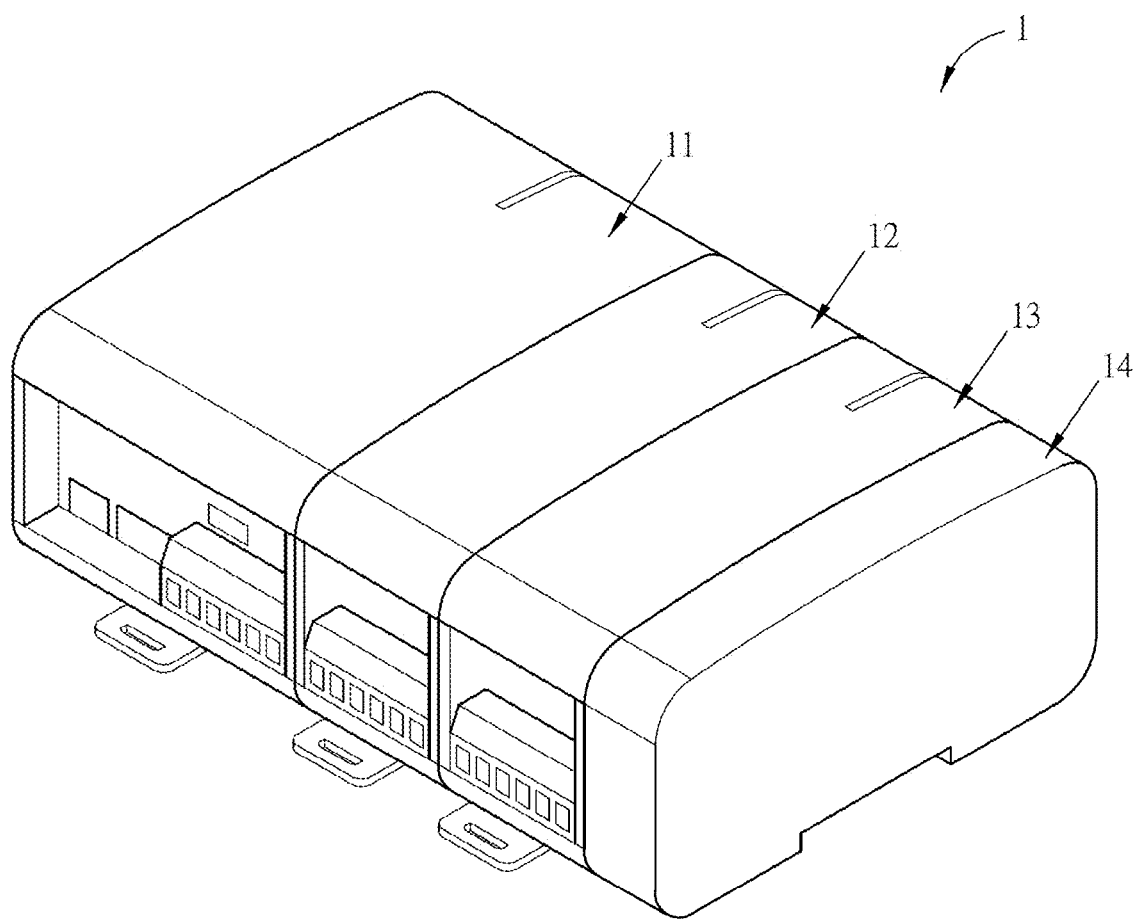
FIG. 1A is a schematic diagram showing an expandable combination electric meter according to an embodiment of this disclosure.
Figure 1B:
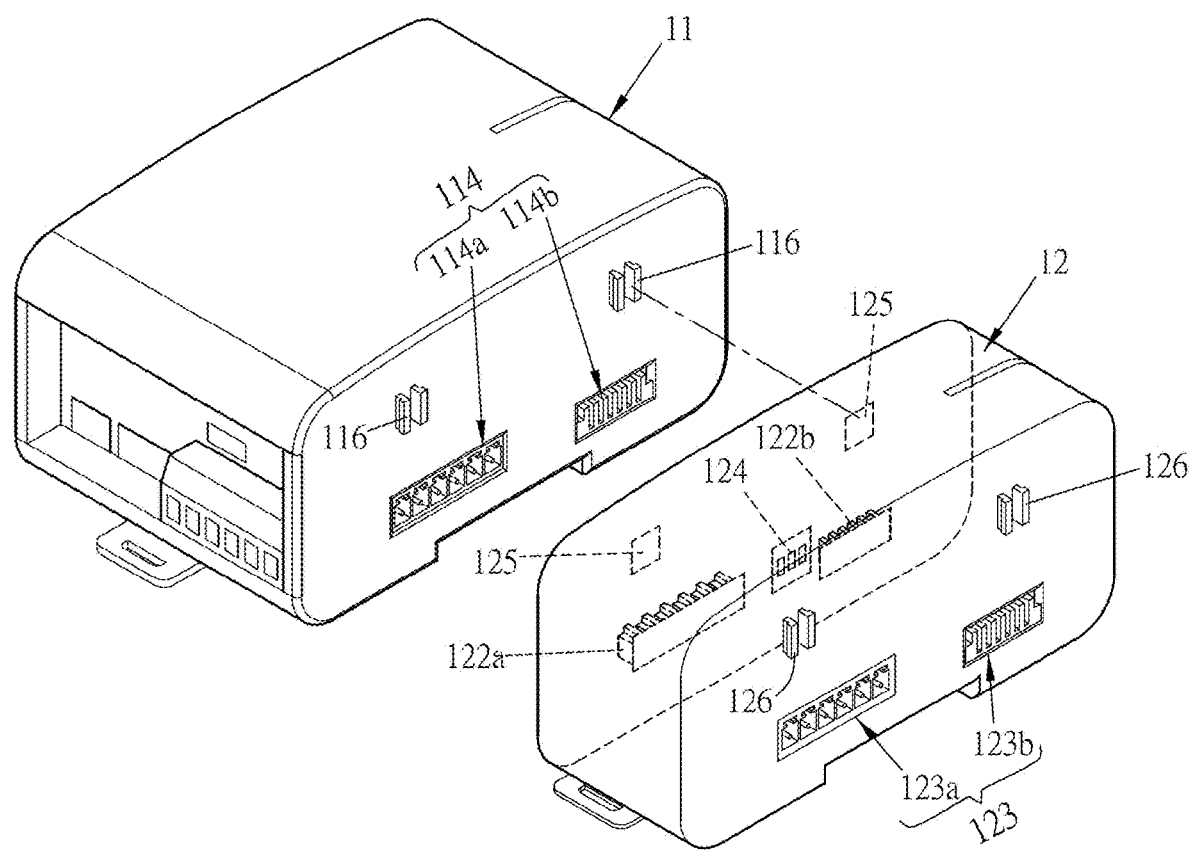
FIG. 1B is a schematic diagram showing the detached first electric meter and second electric meter of the expandable combination electric meter of FIG. 1A.
Figure 2A:
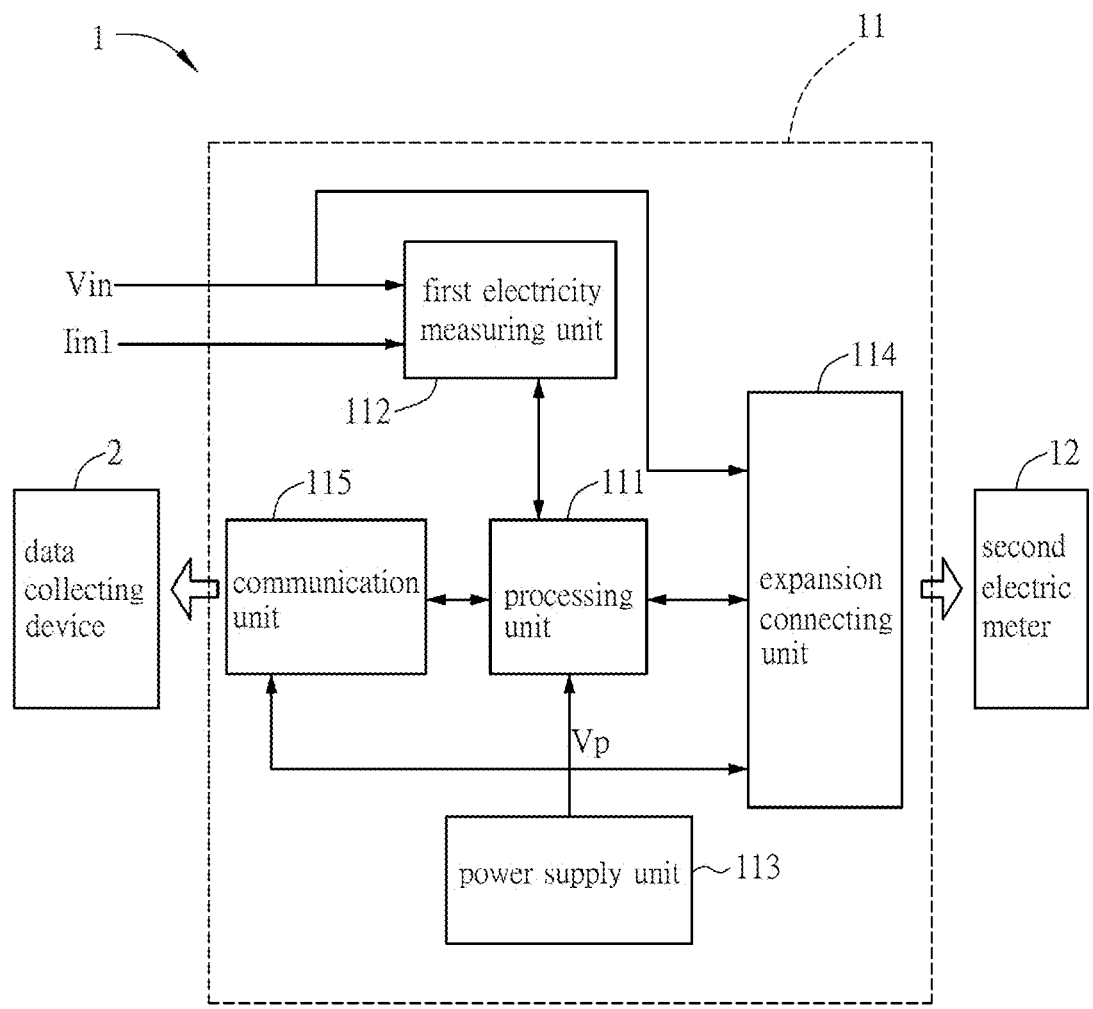
FIG. 2A is a block diagram of the first electric meter of the expandable combination electric meter of FIG. 1A.
Figure 2B:
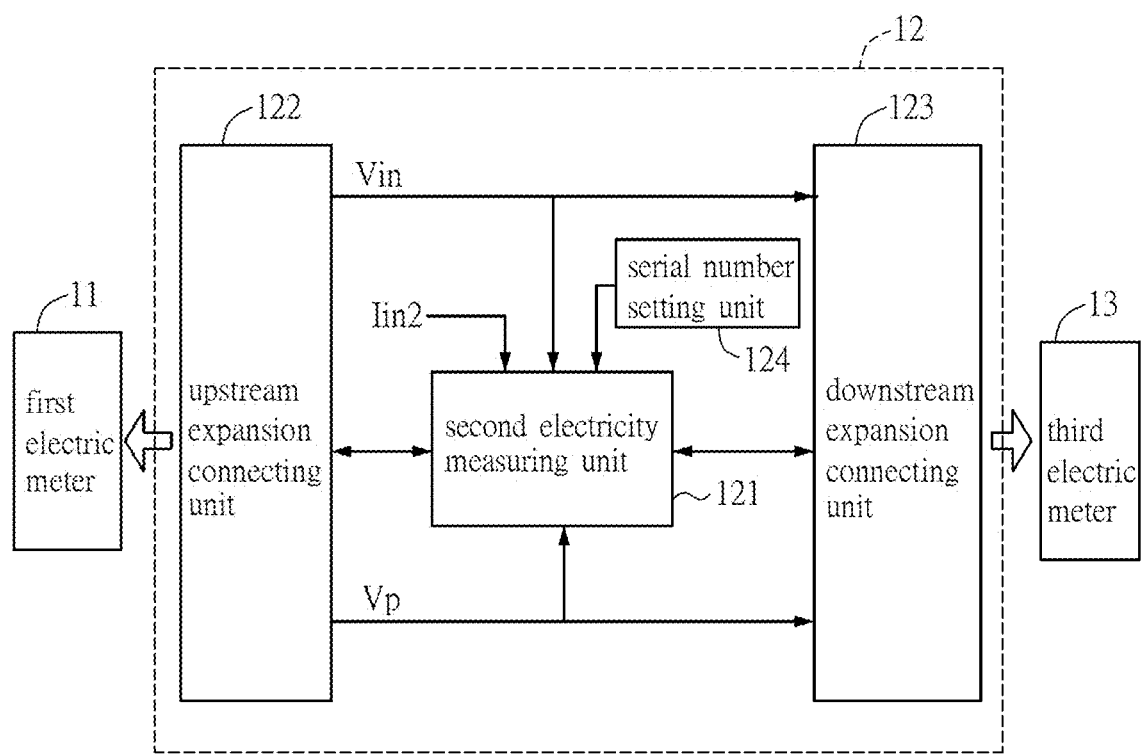
FIG. 2B is a block diagram of the second electric meter of the expandable combination electric meter of FIG. 1A.

FIG. 1A is a schematic diagram showing an expandable combination electric meter according to an embodiment of this disclosure, and FIG. 1B is a schematic diagram showing the detached first electric meter and second electric meter of the expandable combination electric meter of FIG. 1A. FIG. 2A is a block diagram of the first electric meter of the expandable combination electric meter of FIG. 1A, and FIG. 2B is a block diagram of the second electric meter of the expandable combination electric meter of FIG. 1A.

Referring to FIGS. 1A and 1B, an expandable combination electric meter 1 comprises a first electric meter 11 and a second electric meter 12. In addition, the expandable combination electric meter 1 further comprises a third electric meter 13 and a protection cover 14.

The first electric meter 11 is functioned as a main electric meter, and the second electric meter 12 and the third electric meter 13 are functioned as expanded electric meters. In practice, the number of the expanded electric meters can be increased based on the amount of electricity loops involved in the system. As shown in FIG. 1B, the first electric meter 11 is (directly) connected with the second electric meter 12 through the expansion connecting unit 114, and the second electric meter 12 is (directly) connected with the third electric meter 13. For example, if the system includes three electricity loops (three users), the expandable combination electric meter 1 at least comprises the first electric meter 11, the second electric meter 12 and the third electric meter 13, which are connected one by one. The protection cover 14 covers one side of the third electric meter 13 away from the first electric meter 11 for protecting the connection port of the third electric meter 13 and blocking the external moisture or dusts. Alternatively, if there are totally eight electricity loops (eight users), the expandable combination electric meter 1 must comprise the first electric meter 11 and seven expanded electric meters, including the second electric meter 12, the third electric meter 13, a fourth electric meter, a fifth electric meter, a sixth electric meter, a seventh electric meter and an eighth electric meter. The protection cover 14 covers one side of the eighth electric meter away from the seventh electric meter. The amount of the expanded electric meters is not limited. In addition, the expansion connecting unit 114 comprises an analog signal connection port 114*a* and a digital signal connection port 114*b* for respectively transmitting analog signals and digital signals. Of course, the second electric meter 12 also comprises the corresponding analog signal connection port 122*a* and digital signal connection port 122*b* (together referred to an upstream expansion connecting unit) for coupling with the first electric meter 11. The detailed description thereof will be discussed in the following.

Figure 3A:
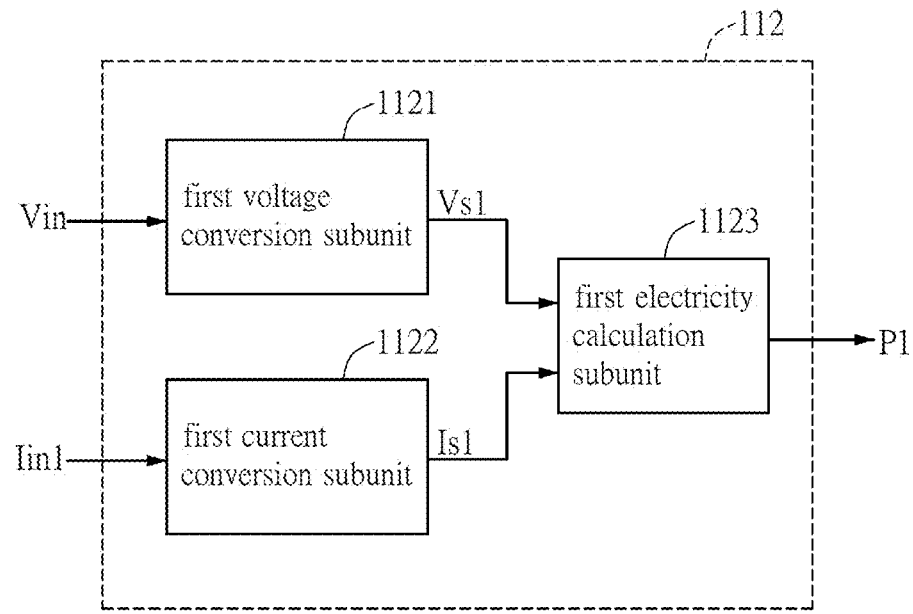
FIG. 3A is a block diagram of the first electricity measuring unit of FIG. 2A.

The components and functions of the first electric meter 11 will be described hereinafter with reference to FIGS. 2A and 3A. FIG. 3A is a block diagram of the first electricity measuring unit 112 of FIG. 2A. As shown in FIG. 2A, the first electric meter 11 comprises a processing unit 111, a first electricity measuring unit 112, a power supply unit 113, an expansion connecting unit 114, and a communication unit 115. The processing unit 111 is coupled with the first electricity measuring unit 112, the power supply unit 113, the expansion connecting unit 114, and the communication unit 115. The processing unit 111 and the first electricity measuring unit 112 can be implemented by a software program, which is executed by a processor. Alternatively, the processing unit 111 and the first electricity measuring unit 112 can be implemented by hardware or firmware, and this disclosure is not limited.

As shown in FIG. 3A, the first electricity measuring unit 112 comprises a first voltage conversion subunit 1121, a first current conversion subunit 1122, and a first electricity calculation subunit 1123. The first voltage conversion subunit

1121 can convert an external input voltage Vin to a first voltage signal Vs1, and the first current conversion subunit 1122 can convert a first external input current Iin1 to a first current signal Is1. In this embodiment, the first voltage conversion subunit 1121 can be, for example but not limited to, a potential transformer (PT), which can convert the external input voltage Vin detected by the voltage detection interface to the first voltage signal Vs1 for the following calculation of electricity consumption data. The first current conversion subunit 1122 can be, for example but not limited to, a current transformer (CT), which can convert the external input voltage (e.g. the first external input current Iin1) detected by the current detection interface to the first current signal Is1 for the following calculation of electricity consumption data. The first electricity calculation subunit 1123 is coupled with the first voltage conversion subunit 1121 and the first current conversion subunit 1122, and the first electricity calculation subunit 1123 calculates with the first voltage signal Vs1 and the first current signal Is1 to generate a first electricity consumption data P1. Herein, the first electricity consumption data P1 can comprise, for example but not limited to, the power, power factor, accumulated electricity consumption unit (e.g. kilowatt hour) of the monitored electricity loop, and the first electricity consumption data P1 can be transmitted to the processing unit 111.

Referring to FIG. 3A, the power supply unit 113 comprises a rectification circuit, and/or a step-up/down circuit, and/or a transformer, and can convert the supply voltage to output a working power Vp to the processing unit 111, the first electricity measuring unit 112, the expansion connecting unit 114, and the communication unit 115 for supplying the power required for the operation of these units. Moreover, the working power Vp can be also transmitted to the second electric meter 12 through the expansion connecting unit 114 of the first electric meter 11 to enable the second electric meter 12. In other words, the power supply unit 113 of the present embodiment can supply the power required for the operation of the first electric meter 11 as well as the expanded electric meter(s) (the second electric meter 12, the third electric meter 13, . . . ).

Figure 3B:
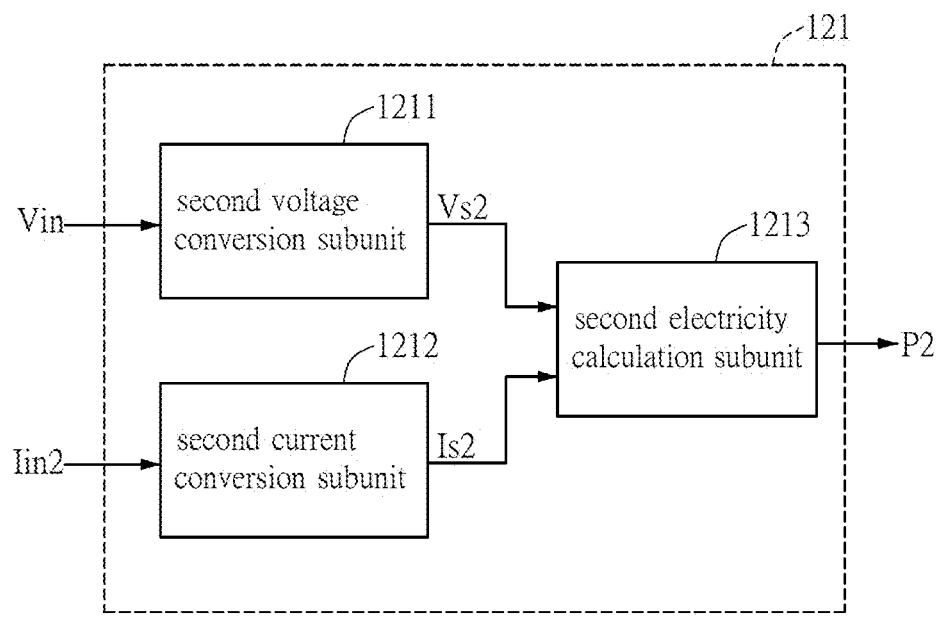
FIG. 3B is a block diagram of the second electricity measuring unit of FIG. 2B.

The components and functions of the second electric meter 12 will be described hereinafter with reference to FIGS. 2B and 3B. FIG. 3B is a block diagram of the second electricity measuring unit 121 of FIG. 2B. To be noted, each of the other expanded electric meters (including the third electric meter 13, the fourth electric meter, . . . ) has the same components and functions as the second electric meter 12. Thus, only the detail structure of the second electric meter 12 will be described hereinafter, the details of the third electric meter 13, the fourth electric meter, and etc. will be omitted.

As shown in FIG. 2B, the second electric meter 12 comprises a second electricity measuring unit 121, an upstream expansion connecting unit 122, and a downstream expansion connecting unit 123. The second electricity measuring unit 121 is coupled with the upstream expansion connecting unit 122 and the downstream expansion connecting unit 123. In this embodiment, the upstream expansion connecting unit 122 comprises an analog signal connection port 122a and a digital signal connection port 122b (referring to FIG. 1B), which are configured corresponding to the analog signal connection port 114a and the digital signal connection port 114b of the expansion connecting unit 114 of the first electric meter 11. In addition, the downstream expansion connecting unit 123 also comprises an analog signal connection port 123a and a digital signal connection port 123b (referring to FIG. 1B). When the second electric meter 12 is connected with the third electric meter 13, the analog signal connection port 123a and the digital signal connection port 123b can be configured corresponding to the analog signal connection port and the digital signal connection port (not shown) of the upstream expansion connecting unit of the third electric meter 13.

In addition, as shown in FIG. 3B, the second electricity measuring unit 121 comprises a second voltage conversion subunit 1211, a second current conversion subunit 1212, and a second electricity calculation subunit 1213. The second voltage conversion subunit 1211 can convert the external input voltage Vin to a second voltage signal Vs2, and the second current conversion subunit 1212 can convert a second external input current Iin2 to a second current signal Is2. In this embodiment, the second voltage conversion subunit 1211 can be, for example but not limited to, a potential transformer, and the second current conversion subunit 1212 can be, for example but not limited to, a current transformer.

In specific, since the operation voltages for all of the loops are the same, when the expansion connecting unit 114 of the first electric meter 11 is connected with the upstream expansion connecting unit 122 of the second electric meter 12, the external input voltage Vin inputted to the first electric meter 11 can be transmitted to the second electric meter 12 through the expansion connecting unit 114 and the upstream expansion connecting unit 122. Thus, the second electric meter 12 can be enabled (driven) by the external input voltage Vin from the first electric meter 11 to calculate the power consumption data. Of course, the external input voltage Vin from the first electric meter 11 can also be transmitted to the consequent third electric meter 13, fourth electric meter, and etc. Accordingly, it is not needed to provide individual external input voltage for each of the expanded electric meters, thereby decreasing the installation wiring. In addition, the second electricity calculation subunit 1213 is coupled with the second voltage conversion subunit 1211 and the second current conversion subunit 1212, and the second electricity calculation subunit 1213 can generate a second electricity consumption data P2 according to the second voltage signal Vs2 and the second current signal Is2. In this embodiment, the second electricity consumption data P2 can comprise, for example but not limited to, the power, power factor, accumulated electricity consumption unit (e.g. kilowatt hour) of the monitored electricity loop. Moreover, when the expansion connecting unit 114 of the first electric meter 11 is connected with the upstream expansion connecting unit 122 of the second electric meter 12, the processing unit 111 can receive the second electricity consumption data P2 through the expansion connecting unit 114 and the upstream expansion connecting unit 122.

Referring to FIGS. 2A and 2B, when the upstream expansion connecting unit 122 of the second electric meter 12 is connected with the expansion connecting unit 114 of the first electric meter 11, the working power Vp and the external input voltage Vin can be transmitted from the first electric meter 11 to the second electricity measuring unit 121 of the second electric meter 12 through the expansion connecting unit 114 and the upstream expansion connecting unit 122. Afterwards, the working power Vp and the external input voltage Vin can be further transmitted from the second electric meter 12 to the upstream expansion connecting unit of the third electric meter 13 through the downstream expansion connecting unit 123 of the second electric meter 12, and so on. Accordingly, it is not needed to configure the individual power supply unit for each of the expanded electric meters, and of course, the corresponding wires for providing the external input voltages from the individual power supply units to the expanded electric meters (e.g. the second electric meter 12, the third electric meter 13, and the likes) are not required. Therefore, the wiring quantity, installation time and circuit cost for installing the main electric meter and the expanded electric meter or for installing the expanded electric meter and the additional expanded electric meter can be decreased. Moreover, the amount of wires and the probability of electrical wiring errors can be reduced. In addition, since the second electric meter 12 (the expanded electric meter) can be connected with the first electric meter 11 (the main electric meter) through the expansion connecting unit 114, the expandable combination electric meter 1 can flexibly increase the amount of electric meters and decrease the installation space of the electric meters according to the number of electricity loops to be monitored.

In addition, the communication unit 115 can comprise a wired and/or wireless communication module, and the data collecting device 2 (comprising, for example, a data collector, a computer, and/or a server) is in communication connection with the processing unit 111 through the communication unit 115. When the upstream expansion connecting unit 122 of the second electric meter 12 is connected with the expansion connecting unit 114 of the first electric meter 11, the data collecting device 2 can issue a command of collecting electricity consumption data to the processing unit 111 through the communication unit 115. Afterwards, the processing unit 111 can schedule the electricity consumption data collections of all electric meters according to the command of the data collecting device 2, and then transmit the electricity consumption data of each meter to the data collecting device 2 through the communication unit 115. The data collecting device 2 can obtain the first electricity consumption data P1 of the first electric meter 11 and the second electricity consumption data P2 of the second electric meter 12, which are obtained in batch through the communication unit 115 and the processing unit 111. If the third electric meter 13 is provided to connect with the second electric meter 12, the data collecting device 2 can retrieve the first electricity consumption data P1, the second electricity consumption data P2, and the third electricity consumption data of the third electric meter 13 in batch.

Moreover, in order to allow the processing unit 111 to identify the amount of the connected expanded electric meters and allow the data collecting device 2 to realize the amount of the effective expanded electric meters through the first electric meter 11, each of the expanded electric meters (e.g. the second electric meter 12) can further comprise a serial number setting unit (e.g. the serial number setting unit 124). In this embodiment, the serial number setting unit 124 can be, for example but not limited to, a DIP switch for setting the serial number of the corresponding electric meter 12. When the expansion connecting unit 114 is connected with the upstream expansion connecting unit 122, the processing unit 11 can retrieve the serial number of the expanded electric meter (the second electric meter 12) through the expansion connecting unit 114 and the upstream expansion connecting unit 122 for identifying the expanded electric meter (the second electric meter 12). In addition, each expanded electric meter (e.g. the second electric meter 12 or the third electric meter 13) has a unique individual serial number, the serial numbers of the second electric meter 12 and the third electric meter 13 are different. Thus, the processing unit 111 can realize the amount of the connected expanded electric meters according to the received serial numbers of the expanded electric meters, thereby facilitating the scheduling of collecting electricity consumption data.

When the main electric meter is combined with the expanded electric meter to form a combined electric meter, the processing unit 111 of the first electric meter 11 can scan the serial number of the connected expanded electric meter (the second electric meter 12, the third electric meter 13, . . . ), so that the data collecting device 2 can recognize the amount of effective expanded electric meters through the communication unit 115 of the first electric meter 11 as the basis for reading the related data of each electric meter. In addition, the processing unit 111 can also schedule the electricity consumption data collections of all electric meters according to the command of the data collecting device 2.

In order to firmly connect the electric meters (preventing detachment caused by vibrations), a connection mechanism can be provided between the first electric meter 11 and the second electric meter 12, between the second electric meter 12 and the third electric meter 13, or between the third electric meter 13 and the fourth electric meter, or the likes. As shown in FIG. 1B, the connection mechanism can comprise at least one protrusion 116 and at least one recess 125 disposed corresponding to the protrusion 116. In this embodiment, the first electric meter 11 comprises two protrusions 116, one side of the second electric meter 12 is configured with two recesses 125, and the other side of the second electric meter 12 is configured with two protrusions 126. The protrusions 126 are disposed corresponding to the recesses of the third electric meter 13. Of course, in other embodiments, the connection mechanism can have different structure or different amount of components for firmly connecting the first electric meter 11 and the second electric meter 12, the second electric meter 12 and the third electric meter 13, or the third electric meter 13 and the fourth electric meter, or the likes. This disclosure is not limited thereto.

As mentioned above, the expandable combination electric meter 1 of the present embodiment has the following features. (1) Expanding flexibility: the number of expanded electric meters can be variable according to the actual needs based on the configuration of the expansion connecting unit. (2) Less installation space for electric meters: the main electric meter and the expanded meter(s) are closely installed, and the size of the expanded electric meter is about half of the main electric meter, so that compared to the conventional electric meter without expansion function, the more expanded electric meters are installed, the larger space is saved. (3) Simplify the wiring quantity: the working power, the external input voltage and the communication wire can be connected through the expansion connecting unit, thereby reducing the amount of the external wiring. For example, the general electric meter without expansion function needs totally 13 connecting lines including four voltage lines (three-phase plus ground line), two power lines, six current sensing lines and one communication line. For each additional electricity loop, 13 additional wires are added to the general electric meter. However, for each additional electricity loop, the expandable combination electric meter of this embodiment only needs six additional wires (reduced by 57%). (4) Good data reading performance: the data collecting device 2 can obtain the electricity consumption data of multiple electricity loops (expanded meters) through the main electric meter in batch, and does not need to query all of the individual electric meters. (5) The expanded electric meter can be connected in any order without following the serial numbers of the expanded electric meters.

In summary, the first electric meter outputs the working power to the processing unit, the first electricity measuring unit and the expansion connecting unit, and the second electric meter is connected with the first electric meter through the expansion connecting unit. The working power outputted from the power supply unit is transmitted to the second electric meter through the expansion connecting unit for enabling the second electric meter. Accordingly, it is unnecessary to configure an individual power supply unit for each expanded electric meter (e.g. the second electric meter), so that the wiring quantity, installation time and circuit cost for installing the main electric meter and the expanded electric meter or for installing the expanded electric meter and the additional expanded electric meter can be decreased. Moreover, the amount of wires and the probability of electrical wiring errors can be reduced. In addition, since the expanded electric meter (e.g. the second electric meter) can be connected with the main electric meter (e.g. the first electric meter) through the expansion connecting unit, the expandable combination electric meter of this disclosure can flexibly increase the amount of electric meters and decrease the installation space of the electric meters according to the number of electricity loops to be monitored.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An expandable combination electric meter, comprising:
a first electric meter comprising a processing unit, a first electricity measuring unit, a power supply unit and an expansion connecting unit, wherein the processing unit is coupled with the first electricity measuring unit, the power supply unit and the expansion connecting unit, and the power supply unit outputs a working power to the processing unit, the first electricity measuring unit, and the expansion connecting unit; and
a second electric meter connected with the first electric meter through the expansion connecting unit;
wherein the working power is transmitted to the second electric meter through the expansion connecting unit for enabling the second electric meter,
wherein the first electricity measuring unit comprises a first voltage conversion subunit and a first current conversion subunit, the first voltage conversion subunit converts an external input voltage to a first voltage signal, and the first current conversion subunit converts a first external input current to a first current signal,
wherein the first electricity measuring unit further comprises a first electricity calculation subunit, the first electricity calculation subunit is coupled with the first voltage conversion subunit and the first current conversion subunit, and the first electricity calculation subunit generates a first electricity consumption data according to the first voltage signal and the first current signal,
wherein the second electric meter comprises a second electricity measuring unit, an upstream expansion connecting unit, and a downstream expansion connecting unit, and the second electricity measuring unit is coupled with the upstream expansion connecting unit and the downstream expansion connecting unit;
wherein the upstream expansion connecting unit is disposed corresponding to the expansion connecting unit, and when the upstream expansion connecting unit is connected with the expansion connecting unit, the working power and the external input voltage are transmitted to the second electricity measuring unit through the expansion connecting unit and the upstream expansion connecting unit.

2. The expandable combination electric meter of claim 1, wherein the second electricity measuring unit comprises a second voltage conversion subunit and a second current conversion subunit, the second voltage conversion subunit converts the external input voltage to a second voltage signal, and the second current conversion subunit converts a second external input current to a second current signal.

3. The expandable combination electric meter of claim 2, wherein the second electricity measuring unit further comprises a second electricity calculation subunit, the second electricity calculation subunit is coupled with the second voltage conversion subunit and the second current conversion subunit, and the second electricity calculation subunit generates a second electricity consumption data according to the second voltage signal and the second current signal.

4. The expandable combination electric meter of claim 3, wherein when the expansion connecting unit is connected with the upstream expansion connecting unit, the processing unit obtains the second electricity consumption data through the expansion connecting unit and the upstream expansion connecting unit.

5. The expandable combination electric meter of claim 4, wherein the first electric meter further comprises a communication unit coupled with the processing unit, and a data collecting device retrieves the first electricity consumption data and the second electricity consumption data in batch through the communication unit and the processing unit.

6. The expandable combination electric meter of claim 1, wherein the second electric meter further comprises a serial number setting unit, the serial number setting unit comprises a serial number, and when the expansion connecting unit is connected with the upstream expansion connecting unit, the processing unit retrieves the serial number through the expansion connecting unit and the upstream expansion connecting unit for identifying the second electric meter.

7. The expandable combination electric meter of claim 1, further comprising:
a third electric meter, wherein the second electric meter is connected with the third electric meter through the downstream expansion connecting unit, and a serial number of the second electric meter is different from a serial number of the third electric meter.

* * * * *